United States Patent [19]

Stone et al.

[11] Patent Number: 4,727,392
[45] Date of Patent: Feb. 23, 1988

[54] PRESSURE DEVELOPMENT APPARATUS FOR IMAGING SHEETS EMPLOYING PHOTOSENSITIVE MICROCAPSULES

[75] Inventors: Benjamin C. Stone, Waynesville; David A. Boyer, Miamisburg; Edward J. Saccocio, Bellbrook; Erik K. Nelson, Centerville, all of Ohio

[73] Assignee: The Mead Corporation, Dayton, Ohio

[21] Appl. No.: 9,851

[22] Filed: Feb. 2, 1987

Related U.S. Application Data

[63] Continuation-in-part of Ser. No. 852,384, Apr. 14, 1986, abandoned, which is a continuation of Ser. No. 733,442, May 13, 1985, abandoned.

[51] Int. Cl.⁴ .................. G03D 9/02; G03C 5/54; G03C 1/72
[52] U.S. Cl. .................. 354/304; 355/27; 430/138; 354/339
[58] Field of Search ........... 430/138; 354/301, 302, 354/303, 304, 305, 86, 297, 339; 355/27, 100; 271/272, 273, 274

[56] References Cited

U.S. PATENT DOCUMENTS

| | | |
|---|---|---|
| 2,191,144 | 2/1940 | Hornbostel . |
| 3,386,824 | 6/1968 | Miller ............... 430/138 |
| 3,678,846 | 7/1972 | Bjorkegren . |
| 4,022,122 | 5/1977 | Moser et al. . |
| 4,145,965 | 3/1979 | Kikuchi et al. . |
| 4,192,229 | 3/1980 | Tsunoi et al. . |
| 4,235,166 | 11/1980 | Tsunoi . |
| 4,338,016 | 7/1982 | Peck et al. ............ 354/303 |
| 4,343,234 | 8/1982 | Sasaki . |
| 4,399,209 | 8/1983 | Sanders et al. ........... 430/138 |
| 4,440,846 | 4/1984 | Sanders et al. ........... 430/138 |
| 4,448,516 | 5/1984 | Arney et al. ............ 355/100 |
| 4,551,407 | 11/1985 | Sanders ............... 430/138 |
| 4,602,408 | 7/1986 | Noe et al. . |
| 4,624,560 | 11/1986 | Beery ................. 355/27 |

Primary Examiner—A. A. Mathews
Attorney, Agent, or Firm—Biebel, French & Nauman

[57] ABSTRACT

Methods and apparatus for pressure developing imaging sheets are described. In a three roll embodiment, first and second rolls are journaled into a housing to form a nip for rupturing microcapsules on the surface of an imaging sheet as it is passed through the nip. Such rolls are aligned at a slight skew angle and are resiliently pressed into one another by means of a third roll supported at a skew angle relative to the roll it contacts. In a two roll embodiment, the first and second rolls are crowned and pressed into contact with one another to present a uniform nip. In a four roll embodiment, the first and second rolls are aligned in parallel with each other, while a skewed roll backs up each of the first and second rolls. The backup rolls may alternatively be crowned. In any embodiment, the imaging sheet is directed into the nip to contact one roll at an angle of arc along the roll ahead of the nip. The nip may be defined partially open in the absence of a sheet, and the pressure rolls may be formed from hardened and chrome plated steel.

9 Claims, 14 Drawing Figures

PRESSURE DEVELOPMENT APPARATUS FOR IMAGING SHEETS EMPLOYING PHOTOSENSITIVE MICROCAPSULES

RELATED APPLICATIONS

This application is a continuation-in-part of application Ser. No. 852,384 filed Apr. 14, 1986 now abandoned, which is a continuation of application Ser. No. 733,442 filed May 13, 1985, now abandoned.

BACKGROUND OF THE INVENTION

The present invention relates generally to an imaging system utilizing imaging sheets having a surface coating of rupturable photosensitive microcapsules and, more particularly, to a method and apparatus for rupturing the microcapsules on such imaging sheets.

U.S. Pat. Nos. 4,440,846 and 4,399,209, which are assigned to The Mead Corporation and hereby incorporated by reference, describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. The imaging system is particularly advantageous because it is a totally dry system and does not rely upon the application of wet developing processing solutions to produce the image. An image-forming chromogenic material, such as a substantially colorless color former, is typically associated with the microcapsules. When the microcapsules rupture, the color former image-wise reacts with a developer material and produces a color image. In the embodiments described in the referenced patents, the microcapsules are typically ruptured by passing image-wise exposed imaging sheets through the between a pair of parallel calender rolls.

The media may exist in either single-sheet or two-sheet versions. In the former case, the microcapsules and developer composition are both coated onto a single substrate layer. In the latter case, the microcapsules are carried on a first substrate layer referred to as a donor sheet. The developer composition is coated onto a second, separate substrate layer referred to as a receiver sheet. The donor sheet is subjected to the actinic radiation, and the exposed microcapsule layer is then brought into contact with the developer layer of the receiver sheet. The two sheets are then developed by pressure, with the finished image being formed in the receiver sheet.

While heavy pressure is not required to rupture the microcapsules, high pressure and large calender rolls are normally used to develop the imaging sheets. To normalize surface irregularities in the imaging sheets, substantial compression of the paper must be achieved. Thus, high pressure and large diameter rolls are necessary to achieve a uniform distribution of the rupturing force across the surface of the imaging sheets. Otherwise, if the rupturing force is not uniformly distributed, the imaging sheets develop unevenly and the tonal characteristics of the resulting images are not good.

In pressure fixation apparatus for fixing a dry pressure fusible toner image onto a sheet of paper, it is known to use a pair of pinch rolls biased toward each other and disposed such that the axis of one roll extends at an angle relative to the axis of the other. This skewed arrangement tends to minimize irregularities of the nip between the rolls even when a paper sheet passes therebetween. However, when the skew angle is too large, creases or wrinkles are formed in the paper sheet. In order to avoid such wrinkles in the paper, the skew angle is kept quite small. With a small skew angle, however, the rolls again must have large diameters to ensure uniform pressure along the nip due to the bending of the rolls. In addition to the added weight of the larger rolls, the loading pressure must also be increased. Hence, larger pressure mechanisms, higher compression-resistant bearings, housings and so forth lead to an increased cost for the apparatus.

To overcome these difficulties in the art of fixing fusible toner images, three roll systems have been used. Such a system is shown in U.S. Pat. No. 4,343,234. In one three-roll system, the two upper rolls form a pair of pinch rolls which are disposed parallel and horizontal with a slight skew angle therebetween. A third back-up roll is disposed in a crossing contact relation to the second roll. The back-up roll is biased resiliently upwards toward the second roll of the pair of pinch rolls by a pressure mechanism such that the second roll is butted against the first roll under pressure to form a nip along their contacting line through which paper sheets pass. The bending of the second roll can be adjusted by the cross angle of the back-up roll relative to the second roll such that both the second roll and the back-up roll may have a smaller diameter than the first roll.

Even in this case, however, the skew angle between the nip rolls must still be relatively small to avoid wrinklin of the sheets.

One significant complication in applying apparatus for fixing fusible toner images to the development of microencapsulated media sheets is the relative magnitudes of pressure required. Typical pressure roll devices for fixing fusible toner images can apply approximately 1000 lbs/in$^2$. For the microencapsulated media, pressures of 6000 to 8000 lbs/in$^2$ are required.

SUMMARY OF THE INVENTION

A principal object of the present invention is to provide an improved method and apparatus for development of imaging sheets employing photosensitive microcapsules and, more particularly, to a method and apparatus for rupturing photosensitive microcapsules which form a photosensitive layer on the surface of an imaging sheet.

A further object of the present invention is to provide an improved method and apparatus for development of imaging sheets utilizing pressure rolls for performing the developing function. More particularly, it is an object to provide such a method and apparatus in which the size and weight of the pressure rolls are reduced compared to cylindrical rolls used in present technologies, while maintaining the required magnitude and even distribution of pressure across the imaging sheet. In addition, it is an object to provide such a method and apparatus which can accommodate relatively wide width materials.

In accordance with one embodiment of the present invention, first and second cylindrical rolls are journalled into the side support members of the housing to form a nip therebetween. These rolls are positioned with their cylindrical axes in parallel. A third, crowned roll is journalled into the side support members, and is positioned against the first roll to resiliently press the first roll into the second roll. A fourth roll, also crowned, is journalled into the side support members and positioned against the second roll for resiliently pressing the second roll into the first roll. An imaging sheet to be developed is passed through the nip between the first and second rolls.

In an alternate embodiment of the present invention, first and second rolls are journalled into the side support members of the housing to form a nip therebetween. These rolls are positioned with their cylindrical axes in parallel. A third roll is journalled into the side support members, and is positioned against the first roll to resiliently press the first roll into the second roll. This third roll is positioned at a skew angle with respect to the first roll. A fourth roll is journalled into the side support members and positioned against the second roll for resiliently pressing the second roll into the first roll. This fourth roll is also positioned at a skew angle with respect to the second roll. Skew angles may be used to increase nip pressure without wrinkling of the paper sheets, since the nip rolls themselves remain parallel.

In conjunction with the embodiments described above, particularly where a two-sheet media is used and where the donor sheet is in the form of a continuous web, the invention may also include means for directing the web to the nip defined between the first and second rolls in such a manner that the web is directed against the surface of the first roll at the head of the nip by a first angle of arc along the circumference of the roll which is greater than zero. Second means directs the receiver sheet to the nip such that the sheet is directed against the surface of the first roll, between the first roll surface and the web, at the same first angle of arc ahead of the nip. Also included may be means for directing the donor web away from the nip such that the web is directed against the surface of the second roll behind the nip by a second angle of arc along the circumference of the second roll that is greater than zero. Preferably, the first and second angles of arc are equal.

Such feature may also be used where both the donor and receiver sheets are in the form of discrete, separated sheets. In such a case, it may be necessary to include a blade disposed against the surface of the first roll ahead of the nip by the first angle of arc. Means is included for feeding the sheets between the surface of the first roll and the blade.

It may also be desirable, in conjunction with the foregoing, to journal the first and second rolls within the side support members such that the rolls are normally spaced apart by a distance of greater than zero, but less than the thickness of the sheet. This minimizes the torque required to move paper sheets into the nip.

Finally, it may also be desirable to utilize first and second rolls which have been case hardened to at least 60 RC to a depth of at least 0.10" (2.5 mm). To the rolls, a layer of hard chrome plate may be applied, such layer being preferably 0.003" (0.075 mm) thick.

Other objects and advantages of the invention will be apparent from the following description, the accompanying drawings and the appended claims.

DETAILED DESCRIPTION OF PREFERRED EMBODIMENTS

Figure 1A:
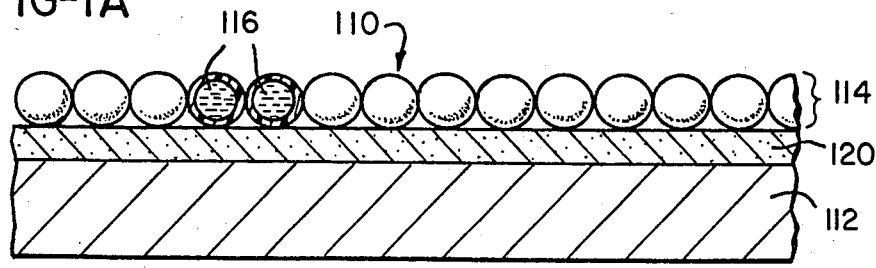
FIGS. 1A-1C show an example of an imaging sheet which may be developed in accordance with the present invention.
Figure 1B:
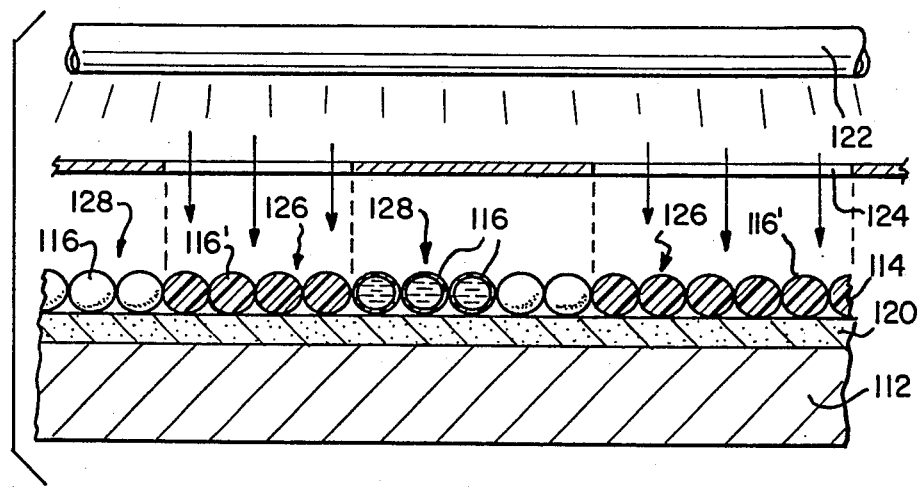
Figure 1C:
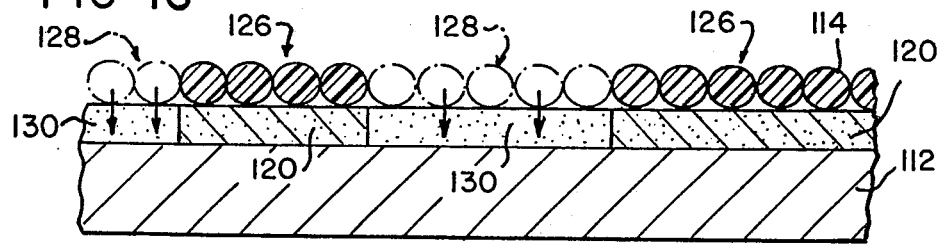

One example of an imaging sheet useful in the present invention is shown in FIGS. 1A-1C. In FIG. 1A, a self-contained imaging sheet 110 is shown. The imaging sheet 110 is constituted by a substrate 112 coated with a layer of microcapsules 114. The microcapsules 114 are filled with an internal phase 116 containing a photosensitive composition. Usually, the microcapsules 114 also contain chromogenic material; however, the chromogenic material can be associated with the microcapsules 114 in other ways, such as by incorporation into the microcapsule wall or in a layer contiguous with the microcapsules 114. Interposed between the layer of microcapsules 114 and the substrate 112 is a layer of a developer material 120. The developer material 120 reacts with the chromogenic material and produces a colored image when the microcapsules 114 are ruptured.

Exposure of the imaging sheet 110 is shown in FIG. 1B wherein a source of radiant energy 122 is positioned above the surface of the imaging sheet 110 with a mask 124 positioned therebetween. In the illustrations of FIGS. 1A-1C, the substrate 112 is opaque and the photosensitive material within the microcapsules 114 is a positive working radiation curable material, i.e., the viscosity of the material increases upon exposure to actinic radiation.

The radiation of the exposed areas 126 causes the radiation curable composition and the internal phase 116 of the microcapsules 114 to polymerize thereby gelling, solidifying or otherwise immobilizing the chromogenic material and preventing the chromogenic material from reacting with the developer material 120. To simplify the illustration, internal phase 116' in the exposed areas 126 is shown as a solid; whereas, the internal phase 116 remains liquid in the unexposed areas 128.

An exposed imaging sheet 110 is processed in accordance with the preferred embodiment of the present invention by introducing the imaging sheet into the nip formed between a pair of pinch rolls wherein the pinch rolls are biased toward one another by means of a third back-up roll and at least the pair of pinch rolls are positioned with the axes of the rolls at a skew angle α relative to one another. As the imaging sheet 110 moves through the nip between the pair of pinch rolls, the microcapsules 114 are ruptured such that the chromogenic material contained within rupturable ones of the microcapsules 114 or otherwise associated therewith can interact with the developer 120.

Figure 2:
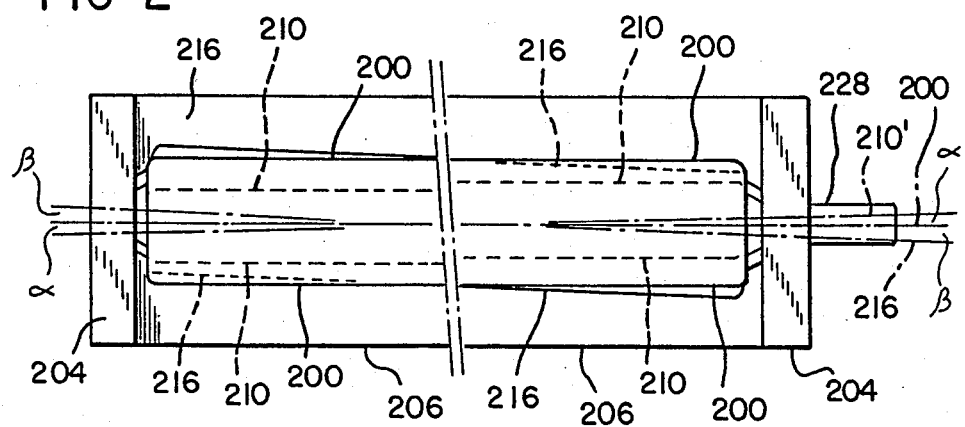
FIG. 2 is a view of one apparatus which may be used for developing the imaging sheet.
Figure 3:
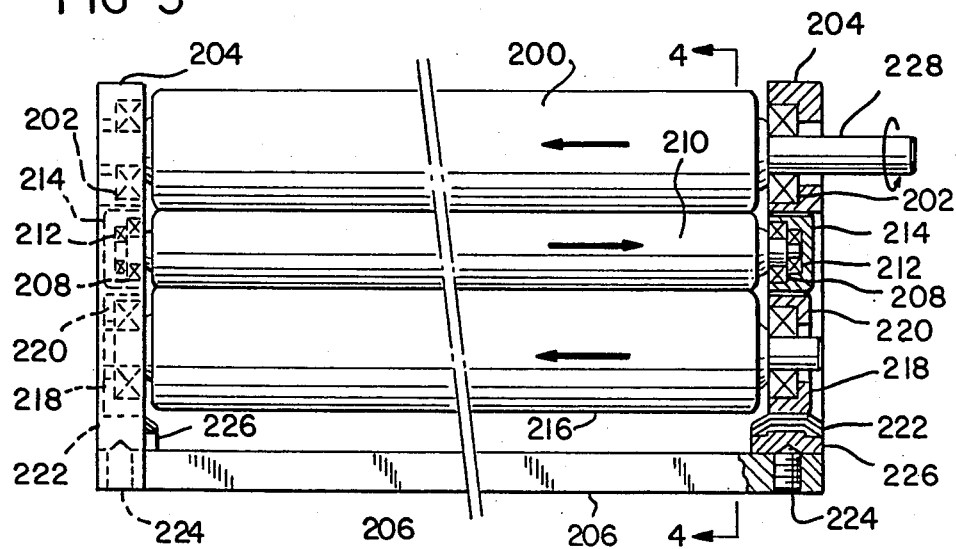
FIG. 3 is a side view of the apparatus of FIG. 1.
Figure 4:
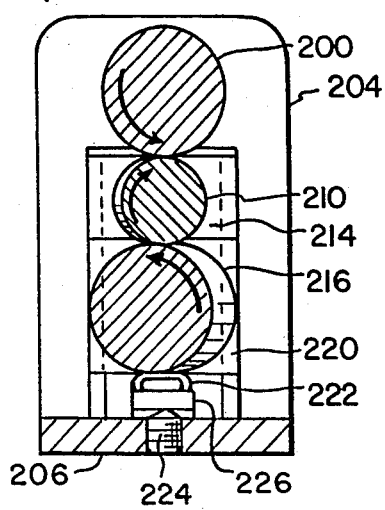
FIG. 4 shows a cross-sectional view taken along a line 4—4 in FIG. 3.

In FIGS. 2-4, one pressure development apparatus for development of imaging sheets is illustrated. A top roll 200 of a pair of pinch rolls is rotatably mounted through needle bearings 202 to a pair of housing side support members 204 mounted on a base 206. Needle bearings 208 and journals of a bottom roll 210 of the pair of pinch rolls are supported by thrust bearings 212 engaged to guide cleats 214 mounted in channels in the side support members 204 such that the bottom roll 210 is vertically slidible in the members 204. The bottom roll 210 is disposed in a cross-position relative to the top roll 200 with a slight skew angle α as represented in FIG. 2.

A back-up roll 216 is supported through needle bearings 218 by guide cleats 220 similar to the support of the bottom roll 210 so as to move vertically. The back-up roll 216 may be disposed in a cross-position relative to the bottom roll 210. Flat springs 222 are mounted below guide cleats 220 which support the back-up roll 216. The flat springs 222 are pushed by pressure bolts 224 through spring shoes 226 whose thrust may be adjusted to correspond to a required pressure by controlling the bolts 224.

As described above, the guide cleats 220 are pushed by the flat springs 222 such that the back-up roll 216 pushes the bottom roll 210 against the top roll 200 to form a nip therebetween. Compensation for the flexing or bending of the bottom roll 210 resulting from an imaging sheet 110 passing through the nip between the top roll 200 and the bottom roll 210 is assured by disposing the back-up roll 216 at a skew angle relative to the bottom roll 210. In the present example, the skew angle of the back-up roll 216 is represented as opposite to that of the bottom roll 210 relative to the top roll 200. The skew angle of the back-up roll 216 with the top roll 200 is represented as angle β as shown in FIG. 2.

Skew angle α can be relatively small as compared with the skew angle of the back-up roll 216 with the pinch rolls 210,200 in the conventional three roll system. This fact is advantageous since it entails easier support mechanism for the back-up roll 216.

In conventional parallel pinch rolls, the pressure applied to an imaging sheet is in a direction substantially perpendicular to the surface of the paper. However, where the top roll 200 and the bottom roll 210 of the pinch rolls are skewed at a slight angle α relative to one another, pressure is exerted not only normally to the paper, but also axially to the rolls. The skew angle α must be selected within a suitable range, since if it is too large, the imaging sheet may be creased and if it is too small, the pressure across the length of the nip may not be uniform.

The skew angle α should be within a range of 10′ to 1°30′ in apparatus provided with a 30 millimeter to 40 millimeter diameter for the top roll 200, a 20 millimeter to 30 millimeter diameter for the bottom roll 210, and a 30 millimeter to 40 millimeter diameter for the back-up roll 216. A skew angle α greater than 1°30′ may cause wrinkles in the imaging sheet, while a skew angle less than 10′ may lead to non-uniform force across the nip of the pinch rolls. When the skew angle is selected within this range, suitable compression and frictional forces are uniformly presented across the nip between the pinch rolls 200 and 210 such that the microcapsules on the surface on the imaging sheet are properly ruptured. The skew angle β of the back-up roll 216 relative to the top roll 200 must be adjusted to provide the proper loading with respect to the diameter and length of the roll.

The pressure development apparatus may include thrust bearings besides the needle bearings for supporting the bottom roll 210. When the drive axle 228 of the top roll 200 rotates in the direction of the circular arrow shown in FIG. 3, the bottom roll 210 and the back-up roll 216 rotate in respective directions of the arrows as shown in FIG. 4. These rolls are affected by respective thrust forces in the directions of the horizontal arrows of FIG. 3 by the rotations and skew angles of the axes of the rolls. Therefore, it may be necessary to provide the ends of the rolls, as shown for example at an end of the bottom roll 210, with a means for receiving the thrust force. FIG. 3 shows an example of an apparatus utilizing both a needle bearing 208 and a thrust bearing 212 but other conventional bearing means for receiving thrust force may also be used.

Figure 6:
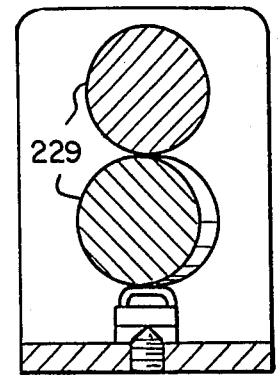
FIG. 6 shows a cross-sectional view taken along line 6—6 in FIG. 5.
Figure 5:
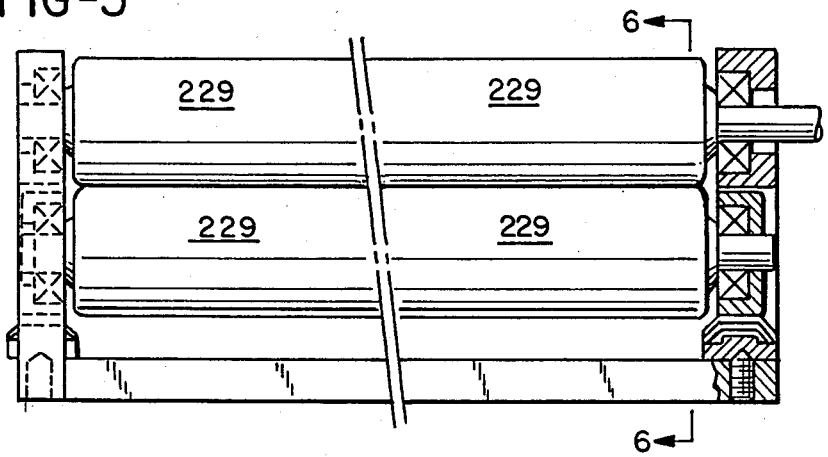
FIG. 5 shows a first alternate embodiment of the apparatus utilizing two skewed rolls.

FIGS. 5 and 6 illustrate an alternate embodiment wherein only two pinch rolls are utilized. In this embodiment, the rolls 229 are mounted at an appropriate skew angle relative to one another ranging from 10′ to 1°30′ and may be of the same diameters, as shown, or may have different diameters. While this embodiment of the present invention can be successfully used to develop imaging sheets, it suffers from the deficiencies noted above for apparatus utilizing two skewed rolls and hence is not preferred.

Figure 7:
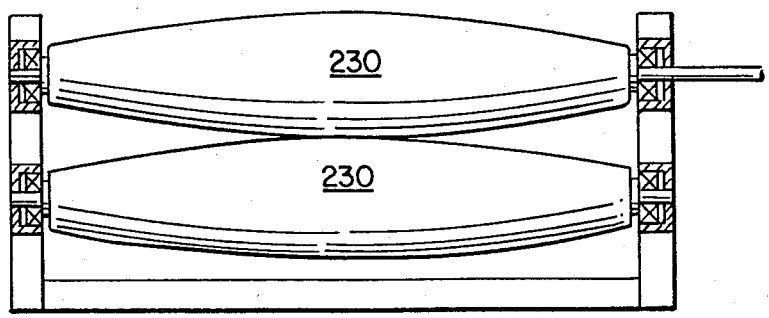
FIG. 7 shows a second alternate embodiment of the apparatus utilizing crowned rolls.

FIG. 7 illustrates a second alternate embodiment wherein only two pinch rolls are utilized. However, the pinch rolls 230 are located with their axes parallel and are crowned, as shown to an exaggerated extent in FIG. 7, to compensate for bending of the rolls as forces are applied to their ends to form a nip between the crowned rolls 230. In this embodiment, as the crowned rolls 230 are forced into engagement with one another to form a nip in a manner similar to that described above with reference to the embodiment of the invention as shown in FIGS. 2-4, the pressure exerted at the ends of the rolls 230 leads to a uniform rupturing force across the length of the nip.

Figure 8:
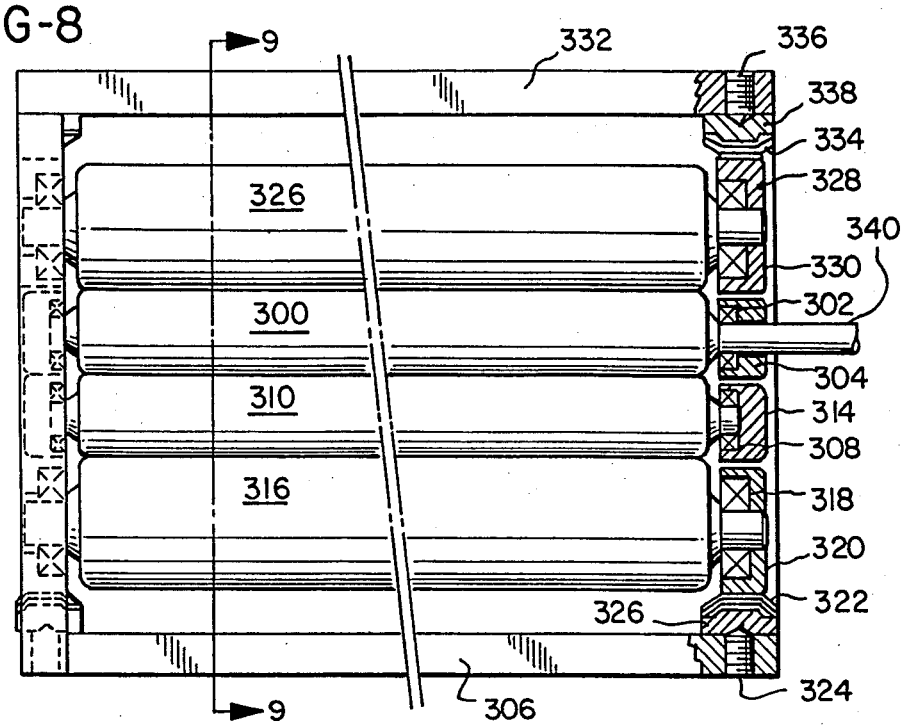
FIG. 8 is a view of a preferred embodiment of the present invention using four rolls.
Figure 9:
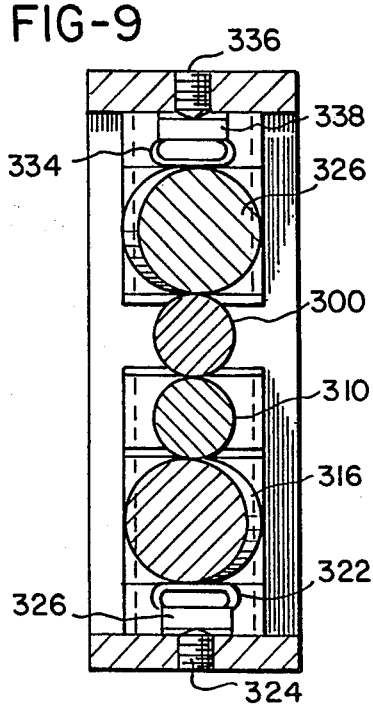
FIG. 9 shows a cross-sectional view taken along line 9—9 of FIG. 8.

A further, and more preferred, embodiment of the present invention can be seen by reference to FIGS. 8 and 9. Four separate rolls are provided. In the three-roll embodiment previously disclosed herein, some skew angle between the rolls defining the nip must be provided. With this, the potential exists for wrinkling of the exposed imaging sheet as it is passed through the nip, even where the skew angle is kept relatively small.

In the four-roll embodiment shown in FIGS. 8 and 9, a first roll 300 of a pair of pinch rolls is rotatably mounted through needle bearings 302 to a pair of housing side support members 304 mounted on a base 306. The needle bearings 308 and journals of a second roll 310 of the pair of pinch rolls are supported in guide cleats 314 mounted in channels in the side support members 304 such that the second roll 310 is vertically slidable in the members 304. The second roll 310 is disposed in parallel relative to the first roll 300; i. e., with no skew between the rolls.

A lower back-up roll 316 is supported through needle bearings 318 by guide cleats 320 similar to the support for the second roll 310 so as to be movable vertically. The lower back-up roll 316 is disposed in a cross position relative to the second roll 210 having a skew angle, as can best be seen in FIG. 9. Flat springs 322 are mounted below guide cleats 320 which support the lower back-up roll 316. The flat springs 322 are pushed by pressure bolts 324 through spring shoes 326 whose thrust may be adjusted to correspond to a required pressure by controlling the bolts 324.

An upper back-up roll 326 is supported through needle bearings 328 by guide cleats 330 in a manner similar to the support for the lower back-up roll 316. Cleats 330 are mounted in channels in the side support members 304 extending downwardly from the upper ends of the channels such that upper back-up roll 326 is vertically slidable into members 304. The upper back-up roll 326 is disposed in a cross position relative to the first roll 300 with a skew angle as shown in FIG. 9. The upper back-up roll is retained by upper cross member 332, and flat springs 334 are mounted above guide cleats U which support the roll 326. Pressure bolts 336 acting through spring shoes 338 enable thrust exerted upon roll 326 to be adjusted to respond to a required pressure.

Driving force is supplied to the developer through shaft 340 connected to first roll 300. Because the rolls are all in mutual contact, driving force is thereby transmitted to each of the four rolls.

Guide cleats 320 are pushed by the flat springs 322, and guide cleats 330 are pushed by the flat springs 334, such that the back-up rolls 316 and 326 push the first and second rolls 300 and 310 against each other to form a nip therebetween.

Compensation for the flexing or bending of the first and second rolls 300 and 310 resulting from an imaging sheet passing through the nip between the rolls is assured by disposing both back-up rolls at skew angles relative to the first and second rolls. As seen in FIG. 9, in the present example, the skew angle of lower back-up roll 316 is represented as opposite to that of the upper back-up roll 326. However, it should be recognized that the skew angles for the upper and lower back-up rolls 326 and 316 may be identical, both in relative direction and in magnitude.

The embodiment disclosed in FIGS. 8 and 9 is particularly advantageous in that the rolls defining the nip through which the imaging sheet passes are disposed in parallel. Thus, the disadvantage associated with skewed rolls, i.e., the tendency to wrinkle the image sheet, is eliminated. At the same time, uniform pressure along the entire length of the first and second rolls is assured through the action of the skewed back-up rolls acting upon the pinch rolls.

In view of the elimination of skew for the rolls along the nip in this embodiment, it is not necessary to limit the skew angles of the back-up rolls to the relatively narrow range permitted in the three roll embodiment discussed earlier herein.

As a further, and most preferred, alternate embodiment, back-up rolls 316 and 326 may be replaced by crowned rolls such as those discussed in the embodiment shown in FIG. 7. It will be noted in this case that the axes of all four rolls are in parallel. The crowned rolls will act in a manner similar to skewed rolls in providing uniform pressure across the length of the pinch rolls.

While the foregoing discussion has been presented with respect to a single imaging sheet, the media under consideration may also be used in two-sheet form. Such media is described in previously referenced U.S. Pat. No. 4,399,209. This media version differs from the single-sheet type in that the microcapsules are carried on a first substrate layer referred to as a donor sheet. The developer composition is coated onto a second, separate substrate layer referred to as a receiver sheet. The donor sheet is subjected to the actinic radiation, and the exposed microcapsule layer is then brought into contact with the developer layer of the receiver sheet. The two sheets are then developed by pressure, with the finished image being formed in the receiver sheet.

When a two-sheet media is used, the pressure developing apparatus described herein is used in the same manner as described for a single-sheet media, and functions in the manner described to produce the finished image.

It should be recognized that it is possible, and is preferred, to form the donor sheet as a continuous web, while the receiver sheets are provided as separate, cut sheets. However, it is also possible to use separate sheets for both the donor and receiver sheets, or to use continuous webs for both donor and receiver materials. Further, two sheets mechanically joined to form an integral set can also be used.

To further reduce wrinkling of the imaging sheets, particularly where a two-sheet media is used, it has been found to be advantageous to control entry of the media into the nip formed between the pinch rolls. The means by which such control is achieved where the donor sheet is in web form and the receiver sheet is in cut sheet form can be seen by reference to FIG. 10. While shown particularly with the embodiment of the four-roll pressure developer, it will be recognized that this feature may be incorporated into any of the pressure roll developers disclosed herein.

Figure 10:
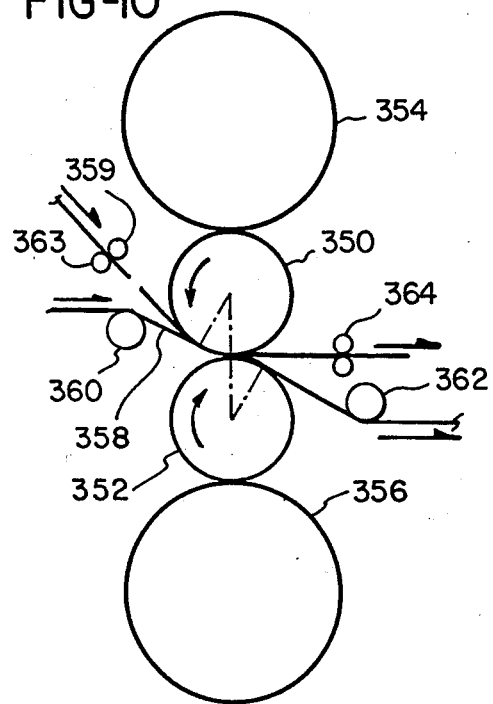
FIG. 10 is a side schematic view of apparatus in accordance with the present invention for guiding a donor web and receiver sheet into the nip of pressure rolls.

As shown schematically in FIG. 10, a first roll 350 and a second roll 352 are disposed in contact to define a nip therebetween. Roll 350 is further contacted by an upper back-up roll 354, while roll 352 is in contact with a lower back-up roll 356. A donor web 358 and receiver sheet 359 are passed through the nip defined by pinch rolls 350 and 352.

Web 358 is directed to approach the roll developer at a level above the nip formed between rolls 350 and 352. A guide roll 360 deflects the web 358 downwardly to cause it to contact the surface of roll 350 at a point circumferentially ahead of the nip. Specifically, web 358 contacts the surface of roll 350 ahead of the nip by a first angle of arc which is greater than zero.

After leaving the nip, web 358 is guided downwardly by guide roll 362 so that the web remains in contact with the second roll 352 for a circumferential distance behind the nip along the surface of roll 352 defined by a second angle of arc which is greater than zero. Preferably, the first and second angles with which the web enters and leaves the nip are the same. Most preferably, this angle is as close to as possible to 90°.

The receiver sheet 359 is directed by feed rolls 363 to contact roll 350 at the first angle of arc ahead of the nip. Sheet 359 is then held between the donor web and the surface of roller 350, and exits the nip in an essentially straight line, whereupon it is removed by exit rolls 364.

Of course, it will be recognized that while web 358 is shown as entering the pressure roll developer at a level above the nip, identical results can be achieved by directing the web to enter the developer from a corresponding level below the nip. In such a case, the web will first contact roll 352 rather than roll 350.

It has been found that by controlling approach of the web to the developer in the manner shown in FIG. 10, the donor web and, more importantly, the receiver sheet are smoothed against the roll in a lower pressure mode prior to entering the high pressure nip of the pinch rolls. This has been found to substantially reduce any tendency of the sheet to be wrinkled as it passes through a nip.

The embodiment shown in FIG. 10 can also be used with a two-sheet media in which both donor and receiver sheets are in the form of continuous webs.

Figure 11:
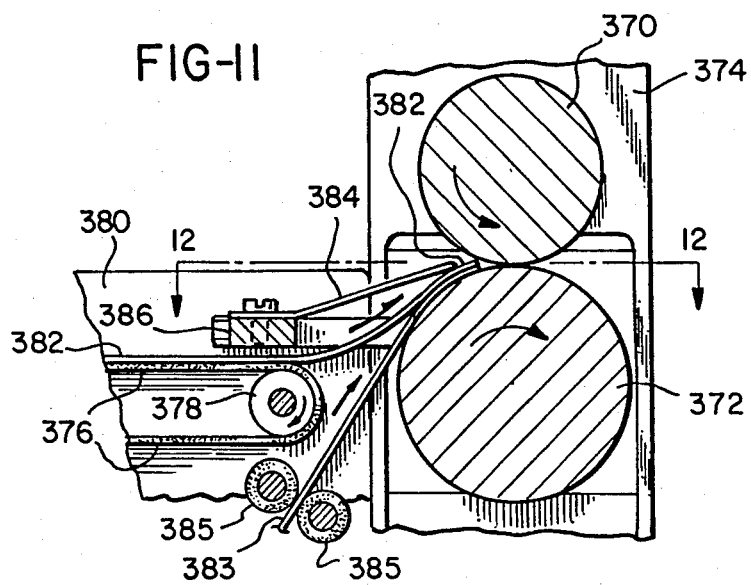
FIG. 11 is a cross-sectional view of an alternate embodiment of the apparatus of FIG. 10 for use with separate donor and receiver sheets.
Figure 12:
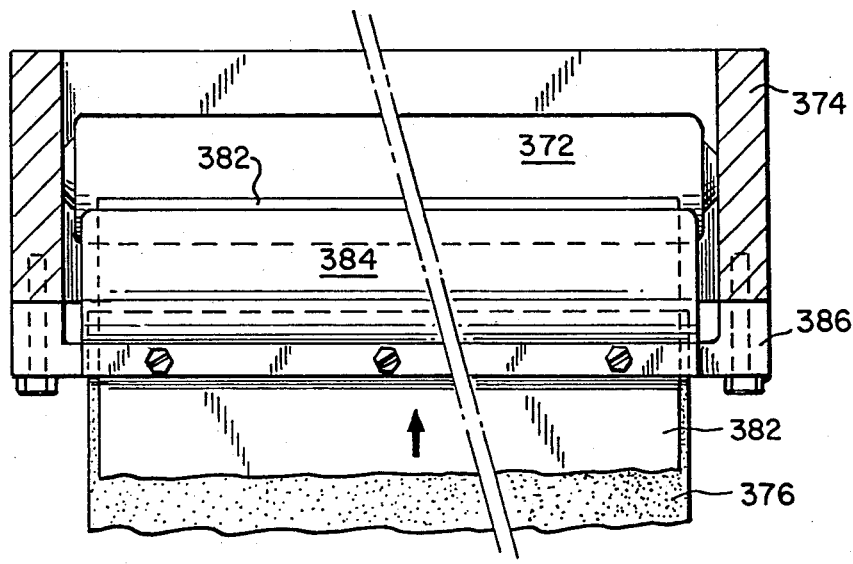
FIG. 12 is a top view of the apparatus of FIG. 11, with the upper roll removed.

A similar technique can be applied where the media constitutes two separate, cut-apart sheets. Referring to FIGS. 11 and 12, a portion of an apparatus is shown including pinch rolls 370 and 372 mounted to housing side members 374. A belt 376 extends around a roll 378 supported between transport side frames 380 for the purpose of conveying donor sheets to the image sheet developer.

As a donor sheet 382 approaches the end of the conveyor including belt 376, the donor sheet is directed onto the surface of lower pinch roll 372, at a level beneath that of the nip defined between the rolls. At the same time, a receiver sheet 383 is fed upwardly from feed rolls 385 to contact the surface of roll 372 at substantially the same location as donor sheet 382.

As the two sheets are drawn upwardly, both as a result of the rearward portion of the sheets continuing to be moved by their respective feed means, and by force exerted upon the sheets by rotating roll 372, the sheets are moved beneath a blade 384 which is supported from a cross member 386 connected between side members 374. The blade edge of blade 384 smooths the sheets into firm contact with roll 372 and provides a tension upon the sheets to prevent wrinkling as they pass through the nip in much the same manner as occurs with the web/sheet media in the embodiment shown in FIG. 10.

Blade 384 is formed from a spring-like material so as to be capable of exerting a load upon sheets passing between the blade and the underlying roll surface. In one preferred example, blade 384 is formed from spring steel having a thickness of 0.005" to 0.015" (0.0125 to 0.0375 mm). The load imparted by blade 384 is primarily determined by the material and thickness, but the loading can be adjusted by shifting the position of blade 384 at its connection point to cross member 386. As can be seen from FIG. 11, blade 384 must be positioned to be in contact with roll 372 ahead of the nip at an angle of arc defined along the circumference of roll 372 that is greater than zero, but less than 90°. Preferably, blade 384 is positioned to contact roll 372 ahead of the nip within the angular range of 15° to 30°.

It will be also recognized by those skilled in the art that blade 384 can be used with a sheet delivery system wherein the sheets are directed to the developer roll system at a level above the nip. In such a case, blade 384 will extend generally downward to contact an upper pinch roll ahead of the nip so that the leading edge of sheets moving off of respective transport or feed means will be pressed against the upper roll through th action of the blade.

Of course, it will also be recognized that the embodiment shown in FIGS. 11 and 12 may be used with the single-sheet media, or with a two-sheet media in which the donor and receiver sheets are joined to form an integral set.

The various embodiments for the pressure roll developer described herein are in part for the purpose of enabling developer rolls of reduced size to be used.

Generally, the disclosed embodiments are intended for use with developer rolls having diameters in the approximate range of 1.0 inch to 2.0 inches (25 to 50 mm), and widths in the approximate range of 8.5 to 17.0 inches (212.5 to 425 mm). One important consideration in determining the diameter of pressure rolls which can be used is the ability of the pressure rolls to pull the imaging sheet into the nip defined between the rolls. Typically, the pinch rolls are located in contact with each other even in the absence of an imaging sheet, so that as the sheet enters the nip, it must force open the rolls. Thus, to a large extent, the paper entry depends upon the normal force achieved upon the rolls as the sheet enters the nip. When the diameter of the rolls is relatively small, the angle of the roll at which the sheet first contacts the rolls will be greater than in the case of larger diameter rolls. Thus, the available force to open the pinch rolls will be relatively small.

One technique which can assist with the entry of the paper between the pinch rolls is to maintain the pinch rolls in a partial open position. This can be accomplished, for example, by locating appropriate stops within the channels in the side support members within which the cleats supporting the rolls are located. Of course, the distance by which the pinch rolls are maintained in an open position must be less than the thickness of the paper sheet to be passed therebetween. In one example, the gap between the pinch rolls can be set at 0.001 inch (0.025 mm). For a typical paper sheet, having a thickness of 0.004" (0.1 mm), a gap of approximately 5 to 10% of the sheet thickness is preferred. This has the effect of reducing the angle of the roll at the point where the sheet first contacts the rolls, enabling a greater separation force on the pinch rolls to be generated. Further, because the nip is already partially open, the net work required to open the nip sufficient to permit the sheet to pass will be reduced.

Finally, in any of the embodiments disclosed herein, rolls having insufficient surface hardness may be susceptible to indentation in the event that a damaged and/or wrinkled sheet of paper passes through the pressure nip. Thus, it is preferred to use steel pressure rolls, each roll being case hardened to a hardness of at least 60 RC to a depth of at least 0.10 inches (2.5 mm). Hard chrome plate is applied to the outer surface of the pressure roll to a thickness of at least 0.003 inch (0.075 mm). In one specific example, a 1.0 inch (25 mm) diameter steel roll was case hardened to 60 RC to a depth of 0.12 inch (3.05 mm), with 0.003 inch (0.075 mm) of hard chrome plate applied. Such a roll was found to perform satisfactorily in resisting indentation.

While the methods herein described, and the forms of apparatus for carrying this method into effect, constitute preferred embodiments of this invention, it is to be understood that the invention is not limited to these precise methods and forms of apparatus, and that changes may be made therein without departing from the scope of the invention, which is defined in the appended claims.

What is claimed is:

1. An apparatus for pressure developing an imaging media including a donor web having a support web with a layer of microcapsules on the surface thereof, said microcapsules containing a photosensitive composition which undergoes a change in viscosity upon exposure to actinic radiation, and a receiver sheet having a support sheet with a development composition coated thereon, comprising:

a housing having first and second side support members;

first and second rolls, each being journalled at both ends in said side support members to form a pair of pinch rolls defining a nip therebetween;

first means for directing the web to said nip such that the web is directed against the surface of said first roll ahead of said nip by a first angle of arc along the circumference of the roll which is greater than zero; and second means for directing the sheet to said nip such that the sheet is directed against the surface of said first roll, between said first roll surface and the web, at said first angle of arc ahead of the nip.

2. Apparatus as defined in claim 1, further comprising third means for directing the web and the sheet away from said nip such that the web and the sheet are directed against the surface of said second roll behind said nip by a second angle of arc along the circumference of said second roll that is greater than zero.

3. Apparatus as defined in claim 1, wherein said first directing means includes a guide roll supported for rotation with respect to said housing so as to direct the web along a tangent to said first roll at said first angle of arc ahead of said nip.

4. Apparatus as defined in claim 1, wherein said first angle of arc is within the range of 0° to 90°.

5. Apparatus as defined in claim 2, wherein said first angle of arc and said second angle of arc are substantially equal.

6. An apparatus for pressure developing an imaging media including a donor sheet having a first support sheet with a layer of microcapsules on the surface thereof, said microcapsules containing a photosensitive composition which undergoes a change in viscosity upon exposure to actinic radiation, and a receiver sheet having a second support sheet with a development composition coated thereon, comprising:

a housing having first and second side support members;

first and second rolls, each being journalled at both ends in said side support members to form a pair of pinch rolls defining a nip therebetween;

first means for directing the donor sheet to said nip such that the donor sheet is directed against the surface of said first roll ahead of said nip by a first angle of arc along the circumference of the roll which is greater than zero; and second means for directing the receiver sheet to said nip such that the receiver sheet is directed against the surface of said first roll, between said first roll surface and the donor sheet, at said first angle of arc ahead of the nip.

7. Apparatus as defined in claim 6, wherein said first and second means for directing the donor sheet and the receiver sheet to said nip includes a blade disposed against the surface of said first roll ahead of said nip by said first angle of arc, means for loading said blade against the surface of said first roll, and further includes means for feeding the donor sheet and the receiver sheet between the surface of said first roll and said blade.

8. Apparatus as defined in claim 7, wherein said blade is formed from spring steel.

9. Apparatus as defined in claim 6, wherein said first angle of arc is within the range of 15° to 30°.

* * * * *

UNITED STATES PATENT AND TRADEMARK OFFICE
CERTIFICATE OF CORRECTION

PATENT NO. : 4,727,392
DATED : February 23, 1988
INVENTOR(S) : Benjamin C. Stone, David A. Boyer, Edward J. Saccocio It is certified that error appears in the above-identified patent and that said Letters Patent is hereby corrected as shown below:

On the Title Page:

Delete Erik K. Nelson as a named inventor.

Signed and Sealed this

Twenty-ninth Day of November, 1988

*Attest:*

DONALD J. QUIGG

*Attesting Officer*   *Commissioner of Patents and Trademarks*